(12) United States Patent
Suzuki (10) Patent No.: US 7,795,625 B2
(45) Date of Patent: Sep. 14, 2010

(54) SEMICONDUCTOR LIGHT-EMITTING DEVICE

(75) Inventor: Masa-aki Suzuki, Osaka (JP)

(73) Assignee: Panasonic Corporation, Osaka (JP)

( * ) Notice: Subject to any disclaimer, the term of this patent is extended or adjusted under 35 U.S.C. 154(b) by 146 days.

(21) Appl. No.: 12/158,434

(22) PCT Filed: Dec. 28, 2006

(86) PCT No.: PCT/JP2006/326194

§ 371 (c)(1),
(2), (4) Date: Jun. 20, 2008

(87) PCT Pub. No.: WO2007/080803

PCT Pub. Date: Jul. 19, 2007

(65) Prior Publication Data

US 2009/0278147 A1  Nov. 12, 2009

(30) Foreign Application Priority Data

Jan. 16, 2006  (JP)  ............................. 2006-007607

(51) Int. Cl.
*H01L 27/15* (2006.01)
*H01L 21/00* (2006.01)

(52) U.S. Cl. .................. 257/81; 257/84; 257/89; 257/100; 257/E33.059; 438/22; 438/26

(58) Field of Classification Search ............ 257/81–84, 257/89, 100, 787; 438/22–26
See application file for complete search history.

(56) References Cited

U.S. PATENT DOCUMENTS

| 6,180,188 | B1  |   | 1/2001 | Belleville et al. |         |
|-----------|-----|---|--------|-------------------|---------|
| 7,388,232 | B2  | * | 6/2008 | Suehiro et al.    | 257/98  |
| 2003/0214233 | A1 |   | 11/2003 | Takahashi et al. |         |
| 2003/0227249 | A1 |   | 12/2003 | Mueller et al. |         |
| 2004/0159849 | A1 |   | 8/2004 | Negley |         |
| 2005/0067944 | A1 |   | 3/2005 | Masuda et al. |         |
| 2005/0093008 | A1 |   | 5/2005 | Suehiro et al. |         |
| 2005/0127378 | A1 |   | 6/2005 | Suehiro et al. |         |
| 2006/0170332 | A1 | * | 8/2006 | Tamaki et al. | 313/498 |

FOREIGN PATENT DOCUMENTS

| JP | 61-96780    | 5/1986  |
| JP | 2001-24236  | 1/2001  |
| JP | 2001-511717 | 8/2001  |
| JP | 2003-342411 | 12/2003 |
| JP | 2004-15063  | 1/2004  |

(Continued)

*Primary Examiner*—Hsien-ming Lee
(74) *Attorney, Agent, or Firm*—Hamre, Schumann, Mueller & Larson, P.C.

(57) ABSTRACT

Disclosed is a semiconductor light-emitting device having improved light-extraction efficiency. Specifically disclosed is a semiconductor light-emitting device (1) comprising a semiconductor light-emitting element (10), a phosphor layer (11) which is so formed as to cover at least a part of the semiconductor light-emitting element (10), and an outer layer (12) which is so formed as to cover at least a part of the phosphor layer (11). The phosphor layer (11) contains a binder (17) and a phosphor (18) dispersed in the binder (17), and the outer layer (12) contains a porous material (19). Consequently, the semiconductor light-emitting device is improved in light-extraction efficiency.

13 Claims, 7 Drawing Sheets

FOREIGN PATENT DOCUMENTS

| | | |
|---|---|---|
| JP | 2004-71908 | 3/2004 |
| JP | 2005-26302 | 1/2005 |
| JP | 2005-93724 | 4/2005 |
| JP | 2005-167091 | 6/2005 |
| JP | 2005-191514 | 7/2005 |
| JP | 2005-285800 | 10/2005 |
| WO | 2006/080299 | 8/2006 |

* cited by examiner

PRIOR ART

SEMICONDUCTOR LIGHT-EMITTING DEVICE

TECHNICAL FIELD

The present invention relates to a semiconductor light-emitting device including a semiconductor light-emitting element.

BACKGROUND ART

As semiconductor light-emitting elements including a semiconductor multilayer film, light emitting diodes (in the following, referred to as "LEDs") have been known. Among them, LEDs emitting blue light such as GaN LEDs can be combined with a phosphor that is excited by blue light and emits fluorescence, and thereby applied to semiconductor light-emitting devices emitting white light.

Figure 12:
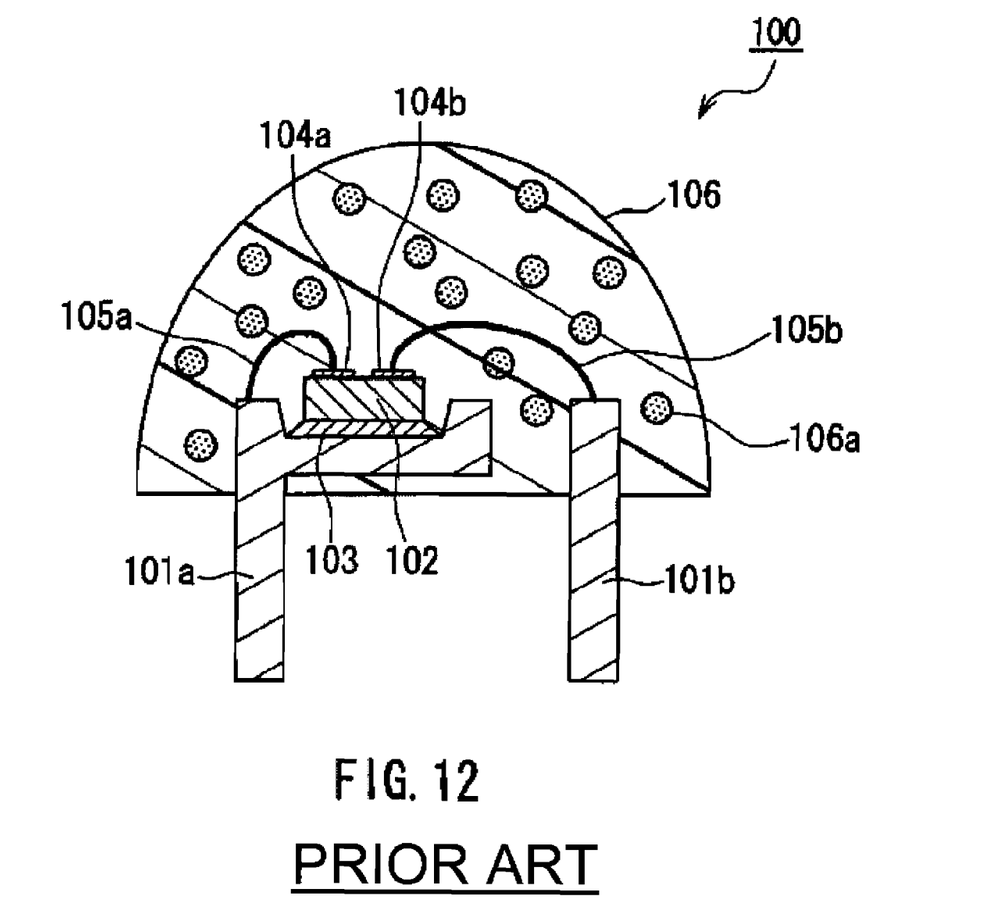
FIG. 12 is a sectional view showing a conventional semiconductor light-emitting device emitting white light.

FIG. 12 is a sectional view showing a conventional semiconductor light-emitting device emitting white light. As shown in FIG. 12, in a semiconductor light-emitting device 100, an LED chip 102 emitting blue light is fixed firmly on a bottom surface of a recessed portion provided at one end of a first lead frame 101a, using a chip fixing paste material 103 formed of an Ag paste or the like.

An upper surface of the LED chip 102 is provided with a first electrode 104a and a second electrode 104b. The first electrode 104a is connected electrically with the first lead frame 101a via a first wire 105a, whereas the second electrode 104b is connected electrically with a second lead frame 101b, which pairs up with the first lead frame 101a, via a second wire 105b.

The LED chip 102 is sealed by a phosphor layer 106 that is shaped like an artillery shell. A binder for the phosphor layer 106 generally can be a resin material that transmits visible light such as an epoxy resin or a silicone resin. Further, in the phosphor layer 106, a phosphor 106a is dispersed (for example, see Patent document 1).

However, when using the epoxy resin or the silicone resin as the binder for the phosphor layer in the conventional semiconductor light-emitting device described above, there arise the following problems.

In the case of using the epoxy resin, since the epoxy resin has a considerably lower refractive index than a material forming the LED chip (for example, GaN), the light extraction efficiency may decline.

In the case of using the silicone resin, because its refractive index is lower than that of the epoxy resin, light emitted from the LED chip is likely to be reflected at an interface with the binder, so that the light extraction efficiency may decline further (for example, see Patent document 2).

In response to this, there have been proposals such as a method of setting the refractive indices from the LED chip toward the outer layer that decrease stepwise (for example, see Patent document 3), a method of using an inorganic oxide or the like having a high refractive index as a sealing material of the LED chip (for example, see Patent document 4), and a method of scattering light by using a porous material for a substrate of the LED chip or forming unevenness on the surface of the above-mentioned substrate (for example, see Patent document 5), for example.

Patent document 1: JP 2004-71908A

Patent document 2: JP 2005-93724 A

Patent document 3: JP 61(1986)-96780 A

Patent document 4: JP 2001-24236 A

Patent document 5: JP 2005-191514A

However, the methods proposed in Patent documents 3 to 5 still have not achieved the light extraction efficiency sufficient for the application to an illuminating apparatus or the like, for example.

DISCLOSURE OF INVENTION

The present invention provides a semiconductor light-emitting device whose light extraction efficiency is improved.

A semiconductor light-emitting device according to the present invention includes a semiconductor light-emitting element, a phosphor layer that is formed so as to cover at least a part of the semiconductor light-emitting element, and an outer layer that is formed so as to cover at least a part of the phosphor layer, wherein the phosphor layer contains a binder and a phosphor that is dispersed in the binder, and the outer layer contains a porous material.

DESCRIPTION OF THE INVENTION

A semiconductor light-emitting device according to the present invention includes a semiconductor light-emitting element, a phosphor layer that is formed so as to cover at least a part of this semiconductor light-emitting element, and an outer layer that is formed so as to cover at least a part of this phosphor layer. The semiconductor light-emitting element can be an LED emitting light with a maximum peak wavelength of equal to or shorter than 490 nm, for example. In particular, an LED chip formed of a GaN compound semiconductor is preferable because it emits blue light (or light with a shorter wavelength than blue light) and has a large emission intensity.

The above-described phosphor layer contains a binder and a phosphor that is dispersed in this binder. The binder can contain, for example, a binder material that transmits visible light. The above-noted binder material can be a resin material formed of an organic polymer such as an epoxy resin, an acrylic resin or a cycloolefin resin, a resin material formed of an inorganic polymer such as a silicone resin, or the like. It also may be possible to use an inorganic material such as a low melting glass or a sol-gel glass that can be formed at low temperatures. As the above-noted phosphor, a phosphor that absorbs a part of light emitted from the semiconductor light-emitting element and emits fluorescence can be used. For example, in the case of using an LED emitting blue light as the semiconductor light-emitting element, the above-noted phosphor can be a yellow phosphor emitting yellow light, a green phosphor emitting green light, a red phosphor emitting red light, or the like. Further, for example, in the case of using an LED emitting ultraviolet light as the semiconductor light-emitting element, it is possible to use the phosphors listed above, a blue phosphor emitting blue light, or the like. By using the phosphor described above, light emitted from the semiconductor light-emitting element and light emitted from the phosphor are mixed together, so that white light can be extracted, for example.

The above-mentioned yellow phosphor can be, for example, yttrium aluminum garnet doped with cerium (abbreviated as YAG:Ce) or the like. The above-mentioned green phosphor can be, for example, ZnS:Cu, Al (abbreviated as P22-GN4), $(Ba, Mg)Al_{10}O_{17}$:Eu, Mn (abbreviated as LP-G3) or the like. The above-mentioned red phosphor can be, for example, $Y_2O_2S$:Eu (abbreviated as P22-RE3) or the like. The above-mentioned blue phosphor can be, for example, $(Sr, Ca, Ba, Mg)_{10}(PO_4)_6Cl_2$:Eu (abbreviated as LP-B1), $(Ba, Mg)Al_{10}O_{17}$:Eu (abbreviated as LP-B4) or the like.

Then, in the semiconductor light-emitting device according to the present invention, the above-described outer layer contains a porous material. This makes it easier to reduce the refractive index of the outer layer. Accordingly, the outer layer having a lower refractive index than the binder in the phosphor layer can be disposed between an outer portion of the semiconductor light-emitting device (for example, an air layer) and the phosphor layer. Consequently, the light extraction efficiency of the semiconductor light-emitting device can be improved.

In the semiconductor light-emitting device according to the present invention, it is preferable that the refractive index of the above-described binder is lower than that of a material forming a principal surface on a light extraction side (in the following, simply referred to as a "light extraction surface") in the above-described semiconductor light-emitting element and higher than that of the above-described outer layer. In this configuration, since the refractive index decreases stepwise from the semiconductor light-emitting element toward the outer layer, the light extraction efficiency can be improved further.

The present invention may have a configuration in which the binder in the above-described phosphor layer contains a binder material and an inorganic particle having an effective particle diameter equal to or smaller than a quarter of a wavelength of light passing through this binder material, and the above-noted inorganic particle has a higher refractive index than the above-noted binder material. With this configuration, incorporating the above-described inorganic particle reduces the difference in refractive index between the binder and the material forming the light extraction surface of the semiconductor light-emitting element. Thus, it is possible to improve the light extraction efficiency further. Moreover, when the above-described inorganic particle is contained, the heat resistance and the light resistance of the binder improve, thus making it possible to prevent the deterioration of the binder. Further, since the effective particle diameter of the above-described inorganic particle is equal to or smaller than a quarter of the wavelength of light passing through the binder material, light scattering occurring in the binder is Rayleigh scattering only. Therefore, it is possible to prevent the deterioration of the light transmittance of the binder. Also, since the size of the above-described inorganic particle is sufficiently smaller than the wavelength of the light, the above-described binder can be considered as a homogenous medium without any variation in refractive index. Incidentally, as long as the above-noted inorganic particle has an effective particle diameter equal to or smaller than 100 nm, the effect described above can be achieved sufficiently for light in a visible region. The "effective particle diameter" mentioned above will be described later.

The above-described inorganic particle can be, for example, an inorganic oxide, a metal nitride, a metal carbide, a carbon compound, a sulfide, or the like.

Examples of the above-mentioned inorganic oxide include titanium oxide (refractive index: 2.2 to 2.5), tantalum oxide (refractive index: 2.0 to 2.3), niobium oxide (refractive index: 2.1 to 2.3), tungsten oxide (refractive index: 2.2), zirconium oxide (refractive index: 2.1), zinc oxide (refractive index: 1.9 to 2.0), indium oxide (refractive index: 2.0), tin oxide (refractive index: 2.0), hafnium oxide (refractive index: 2.0), yttrium oxide (refractive index: 1.9), silicon oxide (refractive index: 1.4 to 1.5), aluminum oxide (refractive index: 1.7 to 1.8), etc. Their complex inorganic oxide also can be used. Examples of the above-mentioned metal nitride include silicon nitride (refractive index: 1.9 to 2.0), etc. Examples of the above-mentioned metal carbide include silicon carbide (refractive index: 2.6), etc. Examples of the above-mentioned carbon compound include diamond (refractive index: 3.0), diamond-like carbon (refractive index: 3.0), etc. Examples of the above-mentioned sulfide include copper sulfide, tin sulfide, etc. It should be noted that the refractive index accompanying the name of each inorganic material listed above indicates a refractive index with respect to visible light (for example, light with a wavelength of 588 nm).

Among the above-described inorganic particles, an inorganic particle containing as a principal component at least one oxide selected from the group consisting of titanium oxide, tantalum oxide, zirconium oxide and zinc oxide, or an inorganic particle made of a complex oxide containing these oxides is preferable because a wide variety of commercial products are readily available. However, since an inorganic compound that exhibits photocatalysis easily by exposure to ultraviolet light such as titanium oxide might deteriorate the binder material, they preferably are used as a rutile crystal structure instead of an anatase crystal structure, which has strong photocatalysis. Alternatively, it also may be possible to use a material obtained by modifying the surface of an inorganic compound with an active photocatalysis with an inorganic compound with an inactive photocatalysis such as silicon oxide, aluminum oxide or the like.

It is preferable to use an inorganic material as the porous material forming the outer layer mentioned above. This is because it becomes possible to improve a heat resistance and a light resistance. The above-noted inorganic material can be, for example, metal oxide, metal fluoride, metal nitride or the like.

Examples of the above-mentioned metal oxide include silicon oxide (refractive index: 1.45), aluminum oxide (refractive index: 1.7 to 1.8), titanium oxide (refractive index: 2.2 to 2.5), zirconium oxide (refractive index: 2.1), zinc oxide (refractive index: 1.9 to 2.0), tantalum oxide (refractive index: 2.0 to 2.3), niobium oxide (refractive index: 2.1 to 2.3), tungsten oxide (refractive index: 2.2), indium oxide (refractive index: 2.0), tin oxide (refractive index: 2.0), hafnium oxide (refractive index: 2.0), yttrium oxide (refractive index: 1.9), magnesium oxide (refractive index: 1.7), etc. It also is possible to use a mixture of these metal oxides and a complex inorganic oxide having a plurality of metallic elements. Examples of the above-mentioned metal fluoride include magnesium fluoride (refractive index: 1.38), calcium fluoride (refractive index: 1.43), etc. Examples of the above-mentioned metal nitride include silicon nitride (refractive index: 1.9 to 2.0), etc. It should be noted that the refractive index accompanying the name of each inorganic material listed above indicates a refractive index with respect to visible light (for example, light with a wavelength of 588 nm).

Among the above-described inorganic materials, silicon oxide, aluminum oxide, magnesium fluoride and calcium fluoride have a low refractive index as bulk. Therefore, by making them porous, it is possible to provide a still lower refractive index. Also, the use of these materials can achieve a lower refractive index than the resin material while having a relatively low porosity. Herein, the porosity refers to the ratio of the volume of pores to the apparent volume of the porous material. A lower porosity is more preferable because the deterioration of strength of the porous material can be suppressed. There is a further advantage in that silicon oxide and aluminum oxide are made of relatively inexpensive raw materials and their commercial products are readily available. Incidentally, the above-noted porosity can be measured by a specific gravity method.

Further, as the porous material forming the outer layer described above, an aggregated porous body of particles formed of the above-mentioned inorganic material may be used. With this configuration, it is possible to achieve a porous material having a continuous structure in which the above-noted particles are connected like a network, so that the expansion and contraction of the air inside the pores caused by temperature variation can be suppressed. This improves the heat resistance and mechanical strength of the outer layer, and is effective in a high-temperature process such as reflow soldering and in the case where the temperature rises during the use of the semiconductor light-emitting device. In the configuration described above, it is preferable that the above-noted particles have a mean particle diameter equal to or smaller than a quarter of a wavelength of light passing through the outer layer, and the above-noted aggregated porous body has a mean pore diameter of equal to or smaller than the quarter of the wavelength of the light passing through the outer layer. In this way, light scattering occurring in the outer layer is Rayleigh scattering only, making it possible to prevent the deterioration of the light transmittance of the outer layer. The above-mentioned mean particle diameter can be determined by a mean particle diameter $d=6/s\rho$ using a mean specific surface area s of the above-noted particles and a true density $\rho$ of a material of these particles by a gas adsorption method. The above-noted mean pore diameter can be determined from Log differential pore volume using a pore distribution measuring device. When both of the above-noted mean particle diameter and the above-noted mean pore diameter are equal to or smaller than 100 nm, the effects described above can be exhibited sufficiently for light in the visible region. An exemplary method for manufacturing the aggregated porous body mentioned above will be described later.

When the mean pore diameter of the aggregated porous body mentioned above is equal to or smaller than 100 nm, it is substantially the same as a mean free path of molecules in a gas, so that the movement of the gaseous molecules in the pore is restricted. Thus, even in the continuous structure, a strong force acts on a network skeleton in the aggregated porous body when the temperature varies abruptly. Accordingly, in a conventional aggregated porous body formed of particles made of the resin material, large expansion and contraction have been likely to occur. With the configuration of the present invention, since the aggregated porous body is formed of the inorganic material, it is possible to achieve a high endurance with respect to the temperature variation, resulting in a high stability.

The semiconductor light-emitting device according to the present invention further may include a light-transmitting layer that is interposed between the semiconductor light-emitting element and the phosphor layer. This is because, since the semiconductor light-emitting element and the phosphor layer are not in contact with each other, it is possible to prevent the deterioration of the phosphor layer due to heat generated from the semiconductor light-emitting element. Incidentally, the material forming the light-transmitting layer is not particularly limited but can be an organic polymer material such as an epoxy resin, an acrylic resin or a cycloolefin resin, an inorganic polymer material such as a silicone resin, glass, a gaseous layer such as nitrogen, or the like.

In the case where the semiconductor light-emitting device according to the present invention includes the light-transmitting layer described above, it is preferable that the refractive index of the light-transmitting layer is lower than that of a material (for example, GaN) forming a light extraction surface in the semiconductor light-emitting element and higher than that of the binder in the phosphor layer. In this configuration, since the refractive index decreases stepwise from the semiconductor light-emitting element toward the phosphor layer, the light extraction efficiency can be improved further.

Also, in the case where the semiconductor light-emitting device according to the present invention includes the light-transmitting layer described above, the light-transmitting layer may contain a base material and an inorganic particle that is dispersed in this base material, and the inorganic particle may have an effective particle diameter equal to or smaller than a quarter of a wavelength of light passing through the base material and a higher reflective index than the base material. With this configuration, incorporating the above-described inorganic particle reduces the difference in refractive index between the light-transmitting layer and the material forming the light extraction surface of the semiconductor light-emitting element. Thus, it is possible to improve the light extraction efficiency further. Moreover, incorporating the above-described inorganic particle improves the heat resistance and the light resistance of the light-transmitting layer, thus making it possible to prevent the deterioration of the light-transmitting layer. Further, since the effective particle diameter of the above-described inorganic particle is equal to or smaller than a quarter of the wavelength of light passing through the base material, light scattering occurring in the light-transmitting layer is Rayleigh scattering only. Therefore, it is possible to prevent the deterioration of the light transmittance of the light-transmitting layer. Also, since the size of the inorganic particle is sufficiently smaller than the wavelength of light, the above-described light-transmitting layer can be considered as a homogenous medium without any variation in refractive index. Incidentally, as long as the above-noted inorganic particle has an effective particle diameter equal to or smaller than 100 nm, the effect described above can be achieved sufficiently for light in the visible region.

The base material forming the above-described light-transmitting layer is not particularly limited but can be an organic polymer material such as an epoxy resin, an acrylic resin or a cycloolefin resin, an inorganic polymer material such as a silicone resin, glass, or the like. Further, as the inorganic particles in the above-noted light-transmitting layer, it is possible to use inorganic particles similar to the inorganic particles that can be dispersed in the binder material described above.

The following is a description of embodiments of the present invention, with reference to the accompanying drawings. In the figures referred to, elements having substantially the same functions are given the same reference signs, and the redundant description will be omitted in some cases.

EMBODIMENT 1

Figure 1A:
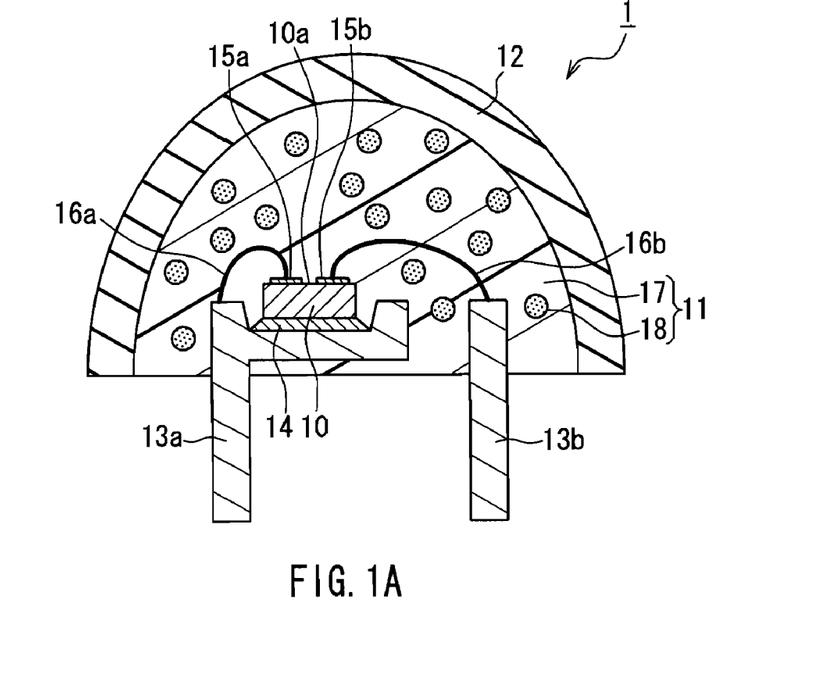
FIG. 1A is a sectional view showing a semiconductor light-emitting device according to Embodiment 1 of the present invention.
Figure 1B:
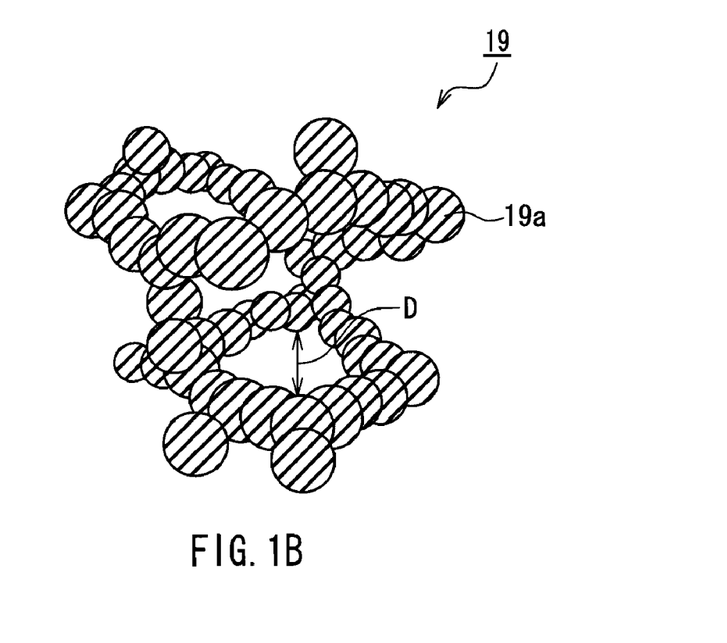
FIG. 1B is a schematic view showing a constituent material of an outer layer included in the semiconductor light-emitting device shown in FIG. 1A.

First, a semiconductor light-emitting device according to Embodiment 1 of the present invention will be described. FIG. 1A is a sectional view showing the semiconductor light-emitting device according to Embodiment 1 of the present invention, and FIG. 1B is a schematic view showing a constituent material of an outer layer included in the semiconductor light-emitting device shown in FIG. 1A.

As shown in FIG. 1A, a semiconductor light-emitting device 1 includes a semiconductor light-emitting element 10, a phosphor layer 11 that is formed so as to cover the semiconductor light-emitting element 10, and an outer layer 12 that is formed so as to cover the phosphor layer 11. The semiconductor light-emitting element 10 is fixed firmly on a bottom surface of a cup-like recessed portion provided at an end of a first lead frame 13a using a fixing paste material 14 formed of an Ag paste or the like.

A light extraction surface 10a of the semiconductor light-emitting element 10 is provided with a first electrode 15a and a second electrode 15b. The first electrode 15a is connected electrically with the first lead frame 13a via a first wire 16a. The second electrode 15b is connected electrically with a second lead frame 13b, which pairs up with the first lead frame 13a, via a second wire 16b.

The phosphor layer 11 contains a binder 17, and a phosphor 18 that is dispersed in the binder 17. This phosphor layer 11 is sealed by the outer layer 12 that is shaped like an artillery shell.

The outer layer 12 is formed of a porous material 19 shown in FIG. 1B. This makes it easier to reduce the refractive index of the outer layer 12. Accordingly, the outer layer 12 having a lower refractive index than the binder 17 in the phosphor layer 11 can be disposed between an outer portion of the semiconductor light-emitting device 1 (for example, an air layer) and the phosphor layer 11. Consequently, the light extraction efficiency of the semiconductor light-emitting device 1 can be improved.

Further, the porous material 19 is formed of an aggregated porous body with a continuous structure in which particles 19a formed of an inorganic material are connected like a network. This makes it possible to suppress the expansion and contraction of the air inside the pores caused by temperature variation. Therefore, the heat resistance and mechanical strength of the outer layer 12 can be improved. Moreover, in the porous material 19, it is preferable that the particles 19a have a mean particle diameter equal to or smaller than a quarter of a wavelength of light passing through the outer layer 12, and an average of pore diameters D of the porous material 19 is equal to or smaller than the quarter of the wavelength of the light passing through the outer layer 12. In this way, light scattering occurring in the outer layer 12 is Rayleigh scattering only, making it possible to prevent the deterioration of the light transmittance of the outer layer 12. For example, it is appropriate that the mean particle diameter of the particles 19a range from 1 nm to 30 nm and the average of the pore diameters D range from 1 nm to 30 nm.

The refractive index of the porous material 19 (namely, the outer layer 12) can be adjusted by controlling the material of the particles 19a, the mean particle diameter of the particles 19a or the size of the pore diameter D of the porous material 19, for example, according to the formula (1) below. Here, in the formula (1) below, $n_p$ indicates the refractive index of the porous material 19, and $n_b$ indicates the refractive index of the material forming the particle 19a. Further, P indicates a filling factor, which is the ratio (by volume) of the material to an entire volume of the porous material 19. Incidentally, the porosity of the porous material 19 can be expressed by 1-P.

$$(n_p^2-1)/(n_p^2+2)=P\times(n_b^2-1)/(n_b^2+2) \quad (1)$$

Figure 2:
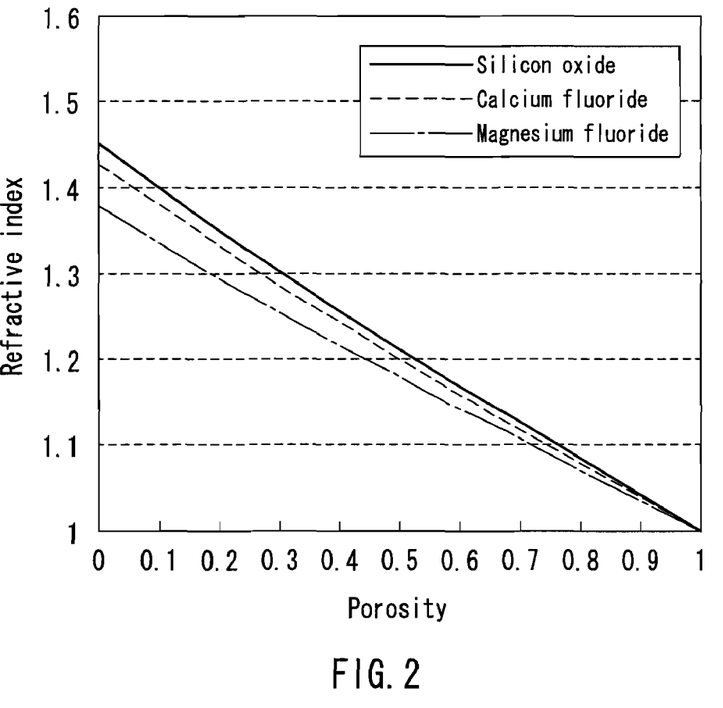
FIG. 2 is a graph showing the relationship between a porosity and a refractive index of a porous material.

FIG. 2 shows the relationship between the porosity and the refractive index of the porous material 19. FIG. 2 shows the cases of using silicon oxide (refractive index: 1.45), calcium fluoride (refractive index: 1.43) and magnesium fluoride (refractive index: 1.38) as the material forming the particles 19a.

Here, when a resin material such as an epoxy resin or a silicone resin is used as the binder 17 (see FIG. 1A), the refractive index of the binder 17 ranges from about 1.4 to about 1.6. Accordingly, by adjusting the refractive index of the porous material 19 to be lower than 1.4, it is possible to improve the light extraction efficiency of the semiconductor light-emitting device 1. For example, in the case of using silicon oxide as the material forming the particles 19a, it is appropriate that the porosity of the porous material 19 be adjusted to be larger than 0.1 as shown in FIG. 2. Incidentally, the lower limit of the refractive index of the porous material 19 is not particularly limited as long as it is higher than the refractive index of the outer portion of the outer layer 12 (for example, 1.0 in the case of the air). However, if the porosity of the porous material 19 is raised in order to lower the refractive index, detrimental effects such as a decrease in the mechanical strength of the porous material 19 may occur. Therefore, it is preferable to adjust the refractive index of the porous material 19 to the extent that the porous material 19 has a porosity of equal to or smaller than 0.95.

Further, the refractive index of the outer layer 12 preferably is between the refractive index of the outer portion of the semiconductor light-emitting device 1 (for example, the air layer) and the refractive index of the binder 17. This is to improve the light extraction efficiency. For example, when the binder 17 has a refractive index ranging from 1.4 to 1.6, it is preferable that the outer layer 12 has a refractive index ranging from 1.1 to 1.3. The porosity of the outer layer 12 in this case ranges from about 0.2 to about 0.8, though it varies depending on the material for the porous material 19. Also, when the binder 17 has a refractive index ranging from 1.6 to 1.8, it is preferable that the outer layer 12 has a refractive index ranging from 1.2 to 1.4. The porosity of the outer layer 12 in this case ranges from about 0.1 to about 0.55, though it varies depending on the material for the porous material 19. Considering the above-described preferable ranges of the refractive index, it is desired that a value obtained by dividing the difference between the refractive index of the binder 17 and that of the outer layer 12 by the sum of the refractive index of the binder 17 and that of the outer layer 12 ranges from 0.03 to 0.2. In particular, the above-described value desirably ranges from 0.1 to 0.15. When the above-described value is smaller than 0.03, the difference between the refractive index of the binder 17 and that of the outer layer 12 is so small that the effect of improving the light extraction efficiency might decline. On the other hand, when the above-described value is larger than 0.2, the difference between the refractive index of the binder 17 and that of the outer layer 12 is so large that the difference in light extraction efficiency from the case of providing no outer layer 12 might be lost.

Moreover, in the semiconductor light-emitting device 1, it is preferable that the refractive index of the binder 17 is lower than that of a material (for example, GaN) forming the light extraction surface 10a (see FIG. 1A) in the semiconductor light-emitting element 10 and higher than that of the outer layer 12. This is because, since the refractive index decreases stepwise from the semiconductor light-emitting element 10 toward the outer layer 12, the light extraction efficiency can be improved further.

Now, a preferred method for forming the porous material 19 (the outer layer 12) will be described. The porous material 19 can be formed, for example, by preparing a sol solution in which a raw material of the porous material 19 is dispersed, turning this sol solution into a wet gel, drying this to obtain a dry gel. The following is a description of the method for forming the porous material 19 in the case of using silicon oxide as the constituent material.

First, a raw material and a catalyst are dispersed in a solvent, thereby obtaining a sol solution. The above-noted raw material can be an alkoxysilane compound such as tetramethoxysilane, tetraethoxysilane, trimethoxymethylsilane or dimethoxydimethylsilane, an oligomer compound thereof, a water glass compound such as sodium silicate (silicate of soda) or potassium silicate. The above-noted catalyst can be, for example, an acid catalyst such as a hydrochloric acid, a sulfuric acid or an acetic acid, a base catalyst such as ammonia, pyridine, sodium hydroxide or potassium hydroxide, or water. The above-noted solvent may be any solvent in which the raw material is dissolved to form silica, and it is possible to use water and organic solvents such as methanol, ethanol, propanol, acetone, toluene and hexane alone or in combination. At this time, by adjusting the concentration of the raw material, it is possible to control the porosity of the resultant porous material 19. As necessary, a viscosity modifier may be added to the above-described solvent. As the viscosity modifier, ethylene glycol, glycerin, polyvinyl alcohol, silicone oil or the like can be used.

Next, the sol solution described above is turned into a wet gel by a sol-gel reaction. For example, the sol solution is stirred and poured into a mold or applied so as to assume a desired form of use, and then allowed to stand for a certain period, whereby the sol solution is turned into a gel, thus obtaining a wet gel having a network skeleton. The temperature condition of obtaining the wet gel can be about 25° C., for example, and may be raised to a temperature not exceeding a boiling point of the solvent as necessary. Also, if needed, an aging treatment may be carried out for maturation of the wet gel or pore control. Furthermore, in order to improve the reliability such as moisture resistance or improve the handleability by adjusting a surface affinity, the surface of the wet gel may be treated with a surface treating agent, as required.

The above-mentioned surface treating agent can be a halogen-based silane treating agent such as trimethylchlorosilane, dimethyldichlorosilane, methyltrichlorosilane, ethyltrichlorosilane or phenyltrichlorosilane, an alkoxy-based silane treating agent such as trimethylmethoxysilane, trimethylethoxysilane, dimethyldimethoxysilane, methyltriethoxysilane or phenyltriethoxysilane, a silicone-based silane treating agent such as hexamethyldisiloxane or dimethyl siloxane oligomer, an amine-based silane treating agent such as hexamethyldisilazane, or an alcohol-based treating agent such as propyl alcohol, butyl alcohol, hexyl alcohol, octanol or decanol. With the surface treating agent described above, it is possible to impart a water repellency, for example, so that the porous material 19 having a high moisture resistance can be obtained. In this way, not only can the breakage of the porous material 19 due to moisture absorption be prevented, but also the entry of moisture into the phosphor layer 11 can be suppressed. Furthermore, since a hydrocarbon group is formed on the surface of the network skeleton, the affinity with the binder 17 increases, so that the adhesion to the phosphor layer 11 is enhanced. When a surface treating agent having a plurality of functional groups such as dimethyldimethoxysilane or methyltriethoxysilane is used as the above-mentioned surface treating agent, molecules of the surface treating agent are crosslinked with each other on the surface of the network skeleton, so that the strength rises, resulting in improved handleability.

Thereafter, the above-mentioned wet gel having the network skeleton is dried so as to be turned into a dry gel. The drying treatment at this time can be air drying, heated-air drying, drying under reduced pressure, supercritical drying, freeze drying or the like. It also may be possible to use a high-boiling solvent for suppressing an evaporation rate or control an evaporating temperature at the time of drying, thereby suppressing the shrinkage of the gel during drying. In particular, the supercritical drying is used preferably as a means for drying that can reduce the shrinkage of the wet gel due to the stress at the time of solvent evaporation so as to obtain a dry gel having an excellent porous performance. Further, by the method of drying the wet gel after treating the surface thereof to be water repellent, the gel shrinkage during drying also can be suppressed. By these methods, it is possible not only to prevent the shrinkage or fracture of the gel during drying but also to form the porous material 19 (the outer layer 12) having a large porosity and a low refractive index. The above-described methods are particularly suitable for forming the porous material 19 whose porosity is equal to or larger than 0.5.

Incidentally, when turning the sol solution into the wet gel, it is appropriate that the sol solution be applied onto the phosphor layer 11 and then allowed to stand (or heated) as described above, for example.

Also, the porous material 19 formed of a dry gel that has been shaped in a desired shape in advance may be attached to the phosphor layer 11 with an adhesive or the like, thereby forming the outer layer 12.

EMBODIMENT 2

Figure 3:
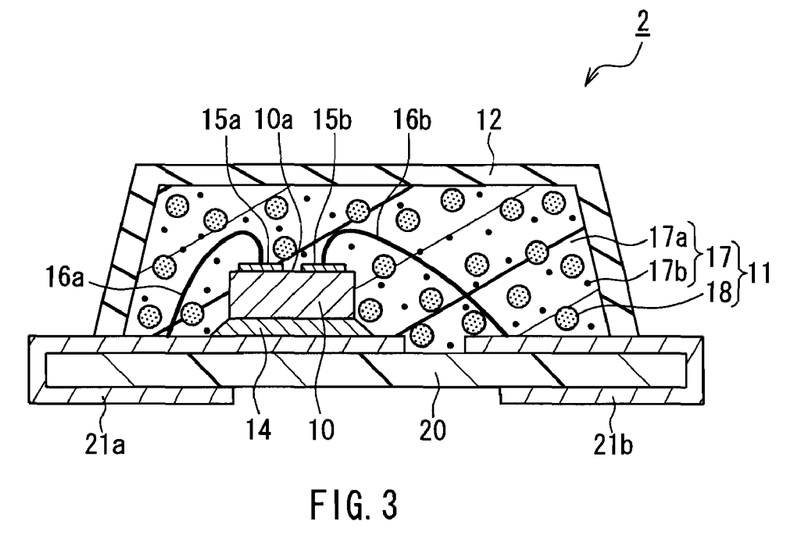
FIG. 3 is a sectional view showing a semiconductor light-emitting device according to Embodiment 2 of the present invention.

Now, a semiconductor light-emitting device according to Embodiment 2 of the present invention will be described. FIG. 3 is a sectional view showing the semiconductor light-emitting device according to Embodiment 2 of the present invention.

As shown in FIG. 3, in a semiconductor light-emitting device 2, a semiconductor light-emitting element 10 is mounted on a substrate 20. The substrate 20 is provided with a first wiring 21a and a second wiring 21b. The first wiring 21a and the second wiring 21b are connected electrically with a first electrode 15a and a second electrode 15b via a first wire 16a and a second wire 16b, respectively.

Further, a binder 17 in a phosphor layer 11 is formed of a composite material containing a binder material 17a and an inorganic particle 17b having an effective particle diameter equal to or smaller than a quarter of a wavelength of light passing through the binder material 17a. The inorganic particle 17b has a higher refractive index than the binder material 17a. With this configuration, incorporating the inorganic particle 17b reduces the difference in refractive index between the binder 17 and the material forming a light extraction surface 10a of the semiconductor light-emitting element 10. Thus, it is possible to improve the light extraction efficiency further. Moreover, incorporating the inorganic particle 17b improves the heat resistance and the light resistance of the binder 17, thus making it possible to prevent the deterioration of the binder 17. Further, since the effective particle diameter of the inorganic particle 17b is equal to or smaller than a quarter of the wavelength of light passing through the binder material 17a, light scattering occurring in the binder 17 is Rayleigh scattering only. Therefore, it is possible to prevent the deterioration of the light transmittance of the binder 17. Also, since the size of the inorganic particle 17b is sufficiently smaller than the wavelength of the light, the binder 17 can be considered as a homogenous medium without any variation in refractive index. Other elements are similar to those in the semiconductor light-emitting device 1 according to Embodiment 1 described above. Thus, the semiconductor light-emitting device 2 also can achieve an effect similar to that of the semiconductor light-emitting device 1.

Figure 4:
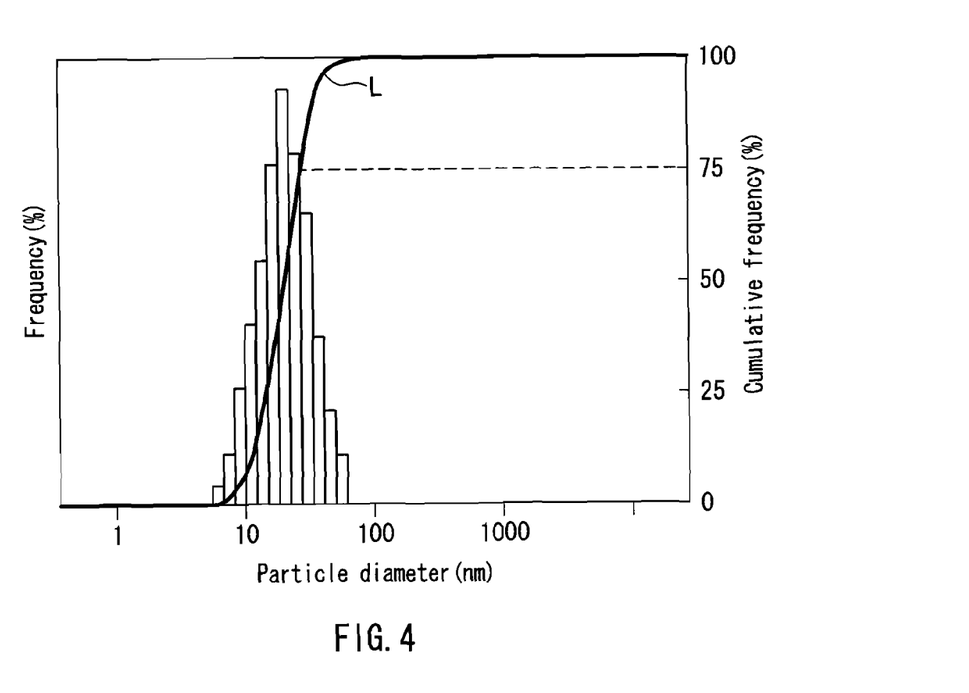
FIG. 4 is a graph for explaining an effective particle diameter in the instant description.

Herein, the "effective particle diameter" mentioned above will be described with reference to FIG. 4. In FIG. 4, the horizontal axis indicates the particle diameter of the inorganic particle 17b, the vertical axis on the left indicates the frequency of the inorganic particle 17b with respect to the particle diameter on the horizontal axis, and the vertical axis on the right indicates the cumulative frequency of the particle diameter of the inorganic particle 17b. This cumulative frequency varies according to a curve L in the case shown in FIG. 4. The "effective particle diameter" in the description of the present application refers to a particle diameter of the inorganic particle 17b when the above-noted cumulative frequency is 75%. The same applies to the case of an inorganic particle 30b, which will be described later. Incidentally, when the inorganic particle 17b is formed of a primary particle, it is appropriate to measure the particle diameter of this primary particle. When the inorganic particle 17b is formed of an aggregated body of the primary particles (for example, a secondary particle), it is appropriate to measure the particle diameter of the above-noted aggregated body. In order to determine an accurate value of the effective particle diameter, it is preferable to measure the particle diameter of each of at least 200 targeted inorganic particles 17b. At this time, the particle diameter of each inorganic particle preferably is measured as a diameter of an equivalent circle using an electron microscope.

When the effective particle diameter of the inorganic particle 17b is smaller than 1 nm, a quantum size effect might be exhibited, so that the color rendering of emission light sometimes is affected. Thus, the effective particle diameter of the inorganic particle 17b preferably is 1 nm to 100 nm and more preferably is 1 nm to 50 nm. Further, in order to ensure a sufficient transparency, it is preferable that the effective particle diameter is 1 nm to 20 nm.

The content by volume of the inorganic particle 17b in the binder 17 preferably is 0.05 to 0.6. An excessively large content by volume of the inorganic particle 17b causes a decrease in the transparency, while an excessively low content by volume of the inorganic particle 17b results in a smaller effect from adding the inorganic particle 17b.

Figure 5:
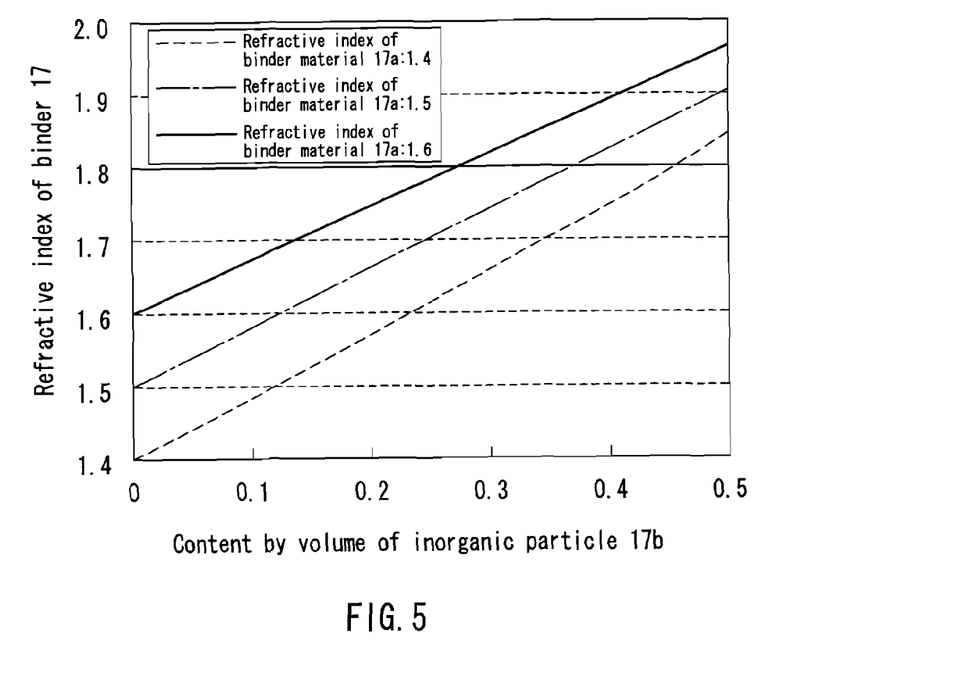
FIG. 5 is a graph showing the relationship between a content by volume of inorganic particles in a binder and a refractive index of the binder.

FIG. 5 shows the relationship between the content by volume of the inorganic particle 17b in the binder 17 and the refractive index of the binder 17 in the cases of using a silicone resin with a refractive index of 1.4, an epoxy resin with a refractive index of 1.5 and an epoxy resin with a refractive index of 1.6 as the binder material 17a and titanium oxide with a refractive index of 2.4 as the inorganic particle 17b. Incidentally, when calculating the refractive index of the binder 17, the formula (2) below by the Maxwell-Garnett theory was used. Here, the binder 17 was considered as a homogenous medium without any variation in refractive index as described above.

$$n_c^2 = n_2^2 \times (n_1^2 + 2n_2^2 + 2P_1(n_1^2 - n_2^2))/(n_1^2 + 2n_2^2 - P_1(n_1^2 - n_2^2)) \quad (2)$$

wherein $n_c$ indicates the refractive index of the binder 17, $n_1$ indicates the refractive index of the inorganic particle 17b, $n_2$ indicates the refractive index of the binder material 17a, and $P_1$ indicates the content by volume of the inorganic particle 17b in the binder 17.

FIG. 5 shows that, in order for the refractive index of the binder 17 to be equal to or higher than 1.8, it is appropriate to set the contents by volume of the inorganic particle 17b in the binder 17 to 0.46, 0.37 and 0.28 respectively for the cases in which the binder material 17a has a refractive index of 1.4, 1.5 and 1.6. Incidentally, a general sealing resin has a refractive index ranging from 1.4 to 1.7. Therefore, in the case of using a general sealing resin as the binder material 17a, it is appropriate that the content by volume of the inorganic particle 17b in the binder 17 be 0.1 to 0.5, and preferably 0.2 to 0.4.

Figure 6:
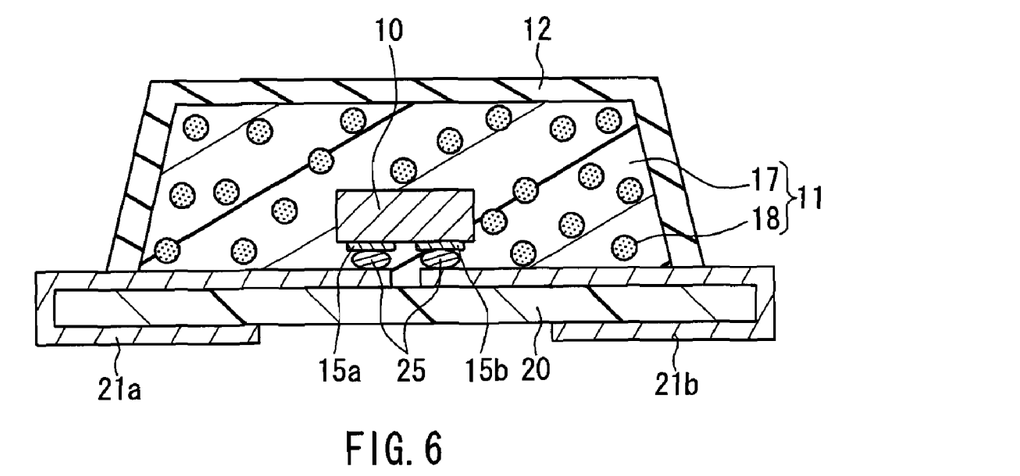
FIG. 6 is a sectional view showing a variation of the semiconductor light-emitting device according to Embodiment 2 of the present invention.

Although an example in which the semiconductor light-emitting element 10 is mounted by wire bonding has been illustrated for the semiconductor light-emitting device 2 shown in FIG. 3, the semiconductor light-emitting element 10 may be flip-chip mounted on the substrate 20 via bumps 25 as shown in FIG. 6. With this configuration, it is possible to reduce the size of the semiconductor light-emitting device.

EMBODIMENT 3

Figure 7:
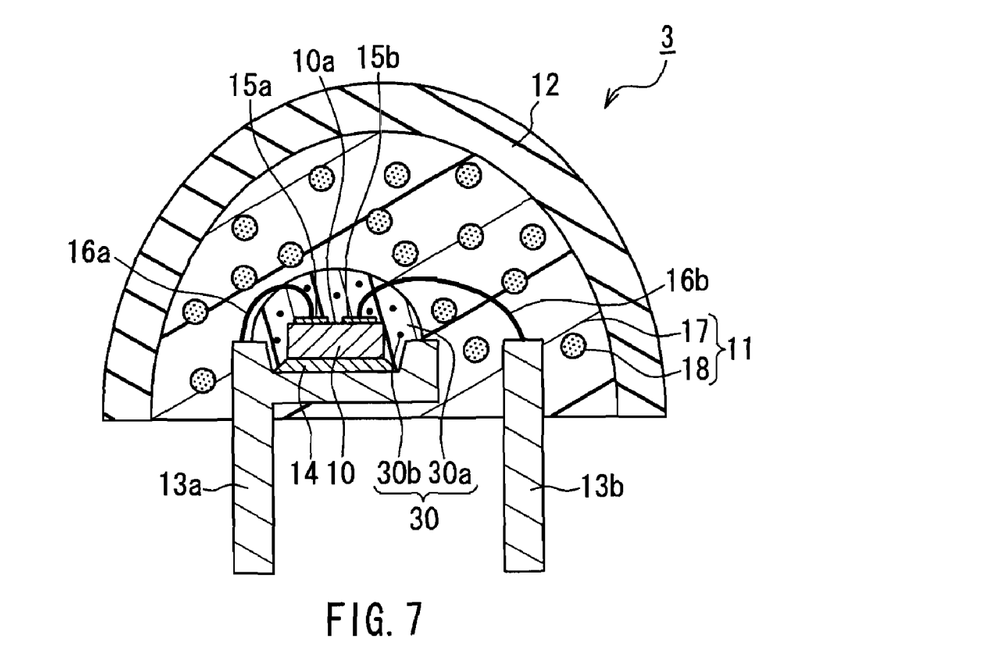
FIG. 7 is a sectional view showing a semiconductor light-emitting device according to Embodiment 3 of the present invention.

Now, a semiconductor light-emitting device according to Embodiment 3 of the present invention will be described. FIG. 7 is a sectional view showing the semiconductor light-emitting device according to Embodiment 3 of the present invention.

As shown in FIG. 7, a semiconductor light-emitting device 3 further includes a light-transmitting layer 30 that is interposed between the semiconductor light-emitting element 10 and the phosphor layer 11, in addition to the configuration of the semiconductor light-emitting device 1 according to Embodiment 1 described above. This makes it possible not only to produce an effect similar to the semiconductor light-emitting device 1 but also to prevent the deterioration of the phosphor layer 11 due to heat generated from the semiconductor light-emitting element 10, because the semiconductor light-emitting element 10 and the phosphor layer 11 are not in contact with each other.

It is preferable that the refractive index of the light-transmitting layer 30 is lower than that of the material forming the light extraction surface 10a of the semiconductor light-emitting element 10 and higher than that of the binder 17 in the phosphor layer 11. This is because, since the refractive index decreases stepwise from the semiconductor light-emitting element 10 toward the phosphor layer 11, the light extraction efficiency can be improved further.

Further, the light-transmitting layer 30 contains a base material 30a and an inorganic particle 30b that is dispersed in this base material 30a. The inorganic particle 30b has an effective particle diameter equal to or smaller than a quarter of a wavelength of light passing through the base material 30a and has a higher refractive index than the base material 30a. With this configuration, incorporating the inorganic particle 30b reduces the difference in refractive index between the light-transmitting layer 30 and the material forming the light extraction surface 10a of the semiconductor light-emitting element 10. Thus, it is possible to improve the light extraction efficiency further. Moreover, incorporating the inorganic particle 30b improves the heat resistance and the light resistance of the light-transmitting layer 30, thus making it possible to prevent the deterioration of the light-transmitting layer 30. Further, since the effective particle diameter of the inorganic particle 30b is equal to or smaller than a quarter of the wavelength of light passing through the base material 30a, light scattering occurring in the light-transmitting layer 30 is Rayleigh scattering only. Therefore, it is possible to prevent the deterioration of the light transmittance of the light-transmitting layer 30. Also, since the size of the inorganic particle 30b is sufficiently smaller than the wavelength of the light, the light-transmitting layer 30 can be considered as a homogenous medium without any variation in refractive index.

EMBODIMENT 4

Figure 8:
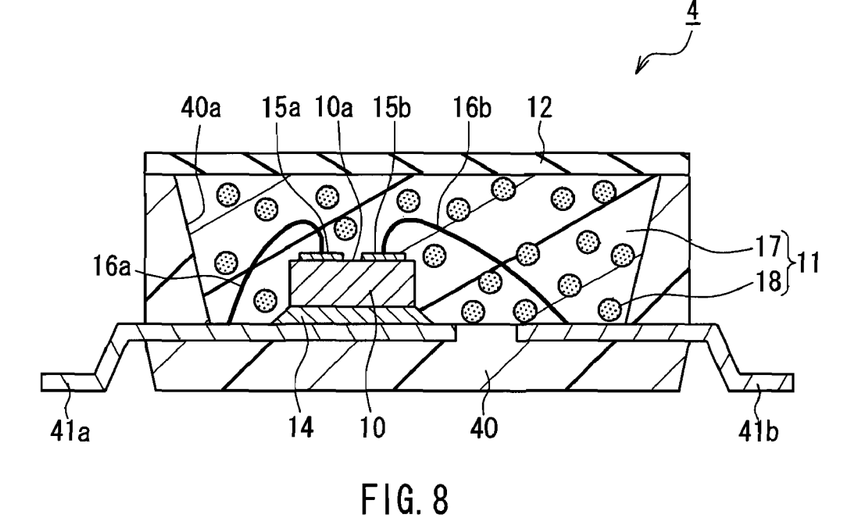
FIG. 8 is a sectional view showing a semiconductor light-emitting device according to Embodiment 4 of the present invention.

Now, a semiconductor light-emitting device according to Embodiment 4 of the present invention will be described. FIG. 8 is a sectional view showing the semiconductor light-emitting device according to Embodiment 4 of the present invention.

As shown in FIG. 8, in a semiconductor light-emitting device 4, a semiconductor light-emitting element 10 is mounted on a bottom surface of a recessed portion 40a provided in a case 40. The case 40 is provided with a first lead 41a and a second lead 41b, which are connected electrically with a first electrode 15a and a second electrode 15b via a first wire 16a and a second wire 16b, respectively. In view of the reflection of visible light, it is preferable to use a white heat-resistant material as a material for forming the case 40. The white heat-resistant material can be, for example, engineering plastics such as polyphthalamide, ceramic material (for example, alumina), or the like.

In the semiconductor light-emitting device 4, a phosphor layer 11 is provided in the recessed portion 40a, and an outer layer 12 is provided further so as to cover an opening of the recessed portion 40a. Other elements are similar to those in the semiconductor light-emitting device 1 according to Embodiment 1 described above. Thus, the semiconductor light-mitting device 4 also can achieve an effect similar to that of the semiconductor light-emitting device 1.

Although leads having a so-called Gull Wing terminal shape have been used as the first lead 41a and the second lead 41b in the semiconductor light-emitting device 4, the present invention is not limited to them.

Further, when forming the outer layer 12 in a manufacturing process of the semiconductor light-emitting device 4, it is preferable to adopt a method of processing the above-described porous material 19 (see FIG. 1B) into a desired shape and then attaching it onto the phosphor layer 11. This simplifies the manufacturing process of the semiconductor light-emitting device 4. Such a method is preferable especially in the case of using the outer layer 12 with a plate shape as shown in FIG. 8, because the manufacturing process is simplified further. When an adhesive is used for attaching the outer layer 12 to the phosphor layer 11, since the outer layer 12 is formed of the porous material 19, an excellent adhesion between the outer layer 12 and the phosphor layer 11 is achieved by an anchoring effect of the porous material 19.

It also is possible to place the outer layer 12 on the phosphor layer 11 before the binder 17 is cured, and then cure the binder 17 and make the phosphor layer 11 and the outer layer 12 adhere to each other at the same time by heat, ultraviolet light or the like. This method also can achieve an excellent adhesion between the outer layer 12 and the phosphor layer 11 by the anchoring effect of the porous material 19. Additionally, when the phosphor layer 11 and the outer layer 12 are made to adhere to each other by the binder 17 as described above, no air layer is formed at an interface between the phosphor layer 11 and the outer layer 12. This leads to an excellent light transmittance, resulting in an improved light emission efficiency.

EMBODIMENT 5

Figure 9:
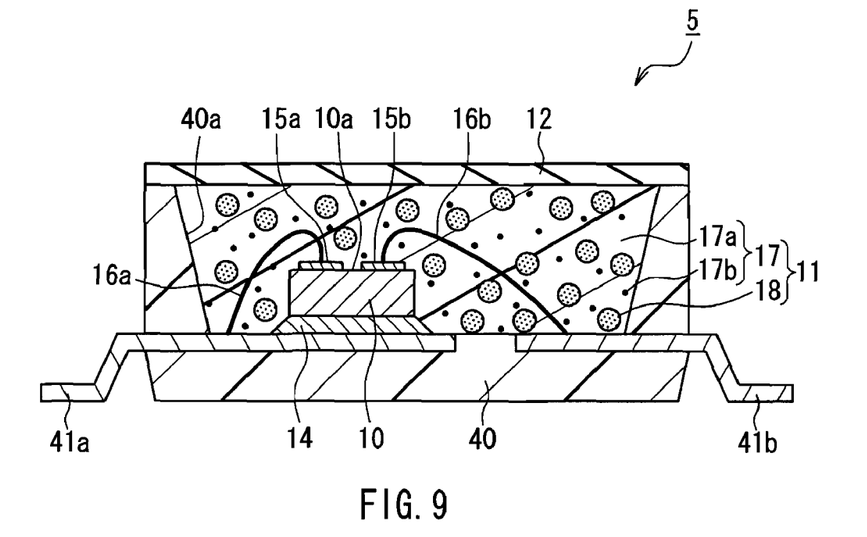
FIG. 9 is a sectional view showing a semiconductor light-emitting device according to Embodiment 5 of the present invention.

Now, a semiconductor light-emitting device according to Embodiment 5 of the present invention will be described. FIG. 9 is a sectional view showing the semiconductor light-emitting device according to Embodiment 5 of the present invention.

As shown in FIG. 9, in a semiconductor light-emitting device 5, a binder 17 of a phosphor layer 11 is formed of a composite material containing a binder material 17a and an inorganic particle 17b having an effective particle diameter equal to or smaller than a quarter of a wavelength of light passing through the binder material 17a. The inorganic particle 17b has a higher refractive index than the binder material 17a. With this configuration, incorporating the inorganic particle 17b reduces the difference in refractive index between the binder 17 and the material forming a light extraction surface 10a of a semiconductor light-emitting element 10. Thus, it is possible to improve the light extraction efficiency further. Moreover, incorporating the inorganic particle 17b improves the heat resistance and the light resistance of the binder 17, thus making it possible to prevent the deterioration of the binder 17. Further, since the effective particle diameter of the inorganic particle 17b is equal to or smaller than a quarter of the wavelength of light passing through the binder material 17a, light scattering occurring in the binder 17 is Rayleigh scattering only. Therefore, it is possible to prevent the deterioration of the light transmittance of the binder 17. Also, since the size of the inorganic particle 17b is sufficiently smaller than the wavelength of the light, the binder 17 can be considered as a homogenous medium without any variation in refractive index. Other elements are similar to those in the semiconductor light-emitting device 4 according to Embodiment 4 described above. Thus, the semiconductor light-emitting device 5 also can achieve an effect similar to that of the semiconductor light-emitting device 4.

EMBODIMENT 6

Figure 10:
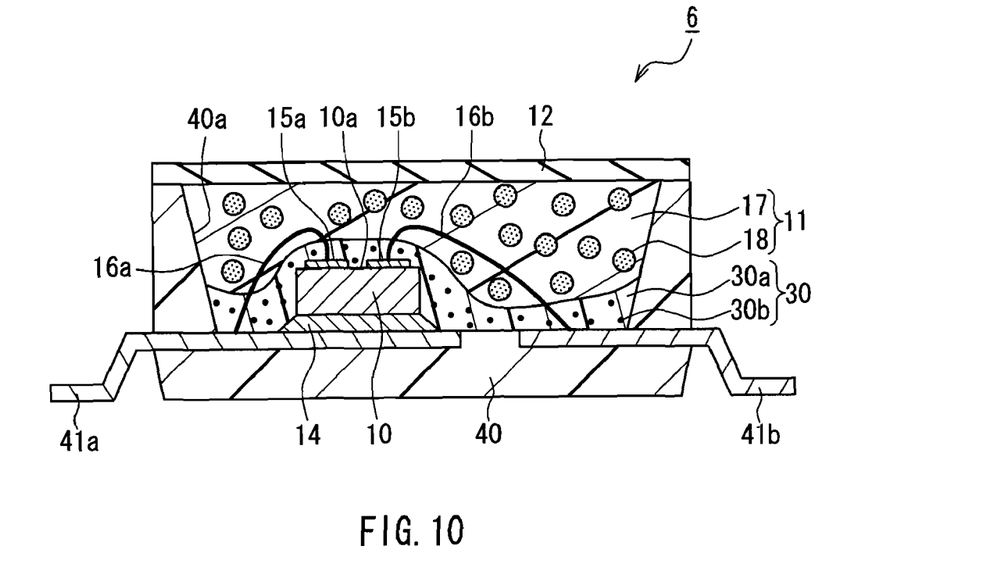
FIG. 10 is a sectional view showing a semiconductor light-emitting device according to Embodiment 6 of the present invention.

Now, a semiconductor light-emitting device according to Embodiment 6 of the present invention will be described. FIG. 10 is a sectional view showing the semiconductor light-emitting device according to Embodiment 6 of the present invention.

As shown in FIG. 10, a semiconductor light-emitting device 6 further includes a light-transmitting layer 30 that is interposed between the semiconductor light-emitting element 10 and the phosphor layer 11, in addition to the configuration of the semiconductor light-emitting device 4 according to Embodiment 4 described above. This makes it possible not only to produce an effect similar to the semiconductor light-emitting device 4 but also to prevent the deterioration of the phosphor layer 11 due to heat generated from the semiconductor light-emitting element 10, because the semiconductor light-emitting element 10 and the phosphor layer 11 are not in contact with each other.

It is preferable that the refractive index of the light-transmitting layer 30 is lower than that of the material forming the light extraction surface 10a of the semiconductor light-emitting element 10 and higher than that of the binder 17 in the phosphor layer 11. This is because, since the refractive index decreases stepwise from the semiconductor light-emitting element 10 toward the phosphor layer 11, the light extraction efficiency can be improved further.

Further, the light-transmitting layer 30 contains a base material 30a and an inorganic particle 30b that is dispersed in this base material 30a. The inorganic particle 30b has an effective particle diameter equal to or smaller than a quarter of a wavelength of light passing through the base material 30a and has a higher refractive index than the base material 30a. With this configuration, incorporating the inorganic particle 30b reduces the difference in refractive index between the light-transmitting layer 30 and the material forming the light extraction surface 10a of the semiconductor light-emitting element 10. Thus, it is possible to improve the light extraction efficiency further. Moreover, incorporating the inorganic particle 30b improves the heat resistance and the light resistance of the light-transmitting layer 30, thus making it possible to prevent the deterioration of the light-transmitting layer 30. Further, since the effective particle diameter of the inorganic particle 30b is equal to or smaller than a quarter of the wavelength of light passing through the base material 30a, light scattering occurring in the light-transmitting layer 30 is Rayleigh scattering only. Therefore, it is possible to prevent the deterioration of the light transmittance of the light-transmitting layer 30. Also, since the size of the inorganic particle 30b is sufficiently smaller than the wavelength of the light, the light-transmitting layer 30 can be considered as a homogenous medium without any variation in refractive index.

EMBODIMENT 7

Figure 11:
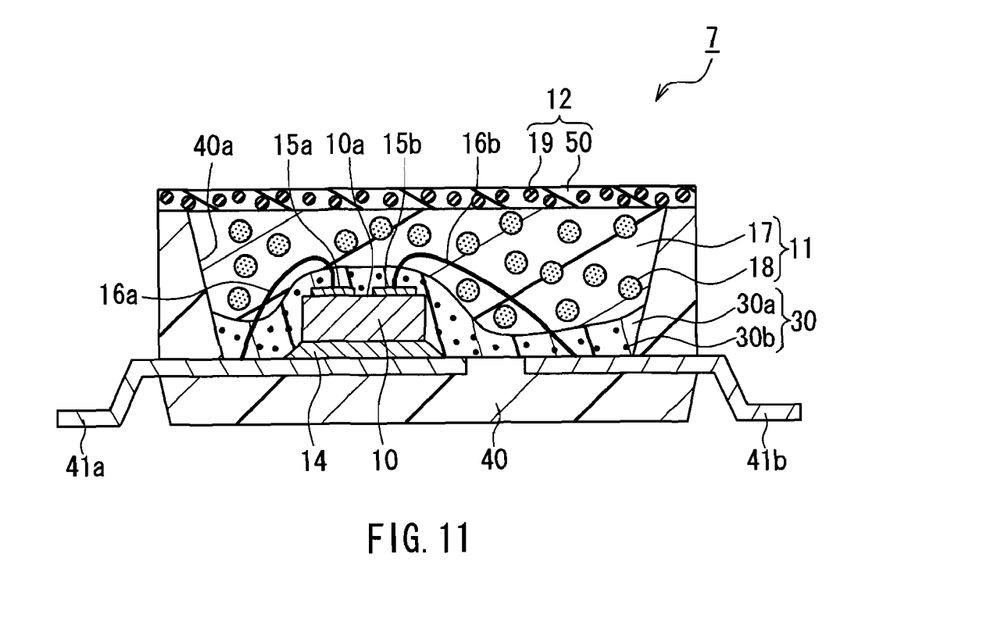
FIG. 11 is a sectional view showing a semiconductor light-emitting device according to Embodiment 7 of the present invention.

Now, a semiconductor light-emitting device according to Embodiment 7 of the present invention will be described. FIG. 11 is a sectional view showing the semiconductor light-emitting device according to Embodiment 7 of the present invention.

As shown in FIG. 11, a semiconductor light-emitting device 7 is different from the semiconductor light-emitting device 6 according to Embodiment 6 described above only in the configuration of the outer layer 12. The outer layer 12 of the semiconductor light-emitting device 7 contains a dispersion medium 50 and a porous material 19 that is dispersed in this dispersion medium 50. In this way, the porous material 19 is protected by the dispersion medium 50, thereby improving a wear resistance of the outer layer 12. The porous material 19 can be obtained by pulverization or the like of the material described in Embodiment 1. The diameter of a particle 19a forming the porous material 19 (see FIG. 1B) is appropriate as long as it is sufficiently larger than the wavelength of visible light, and preferably is 1 μm to 500 μm. A diameter smaller than 1 μm might reduce the porosity because the dispersion medium 50 fills the pores in the porous material 19 when binding the porous material 19. A diameter larger than 500 μm might bring about non-uniform dispersion of the porous material 19. A preferable mixture ratio of the dispersion medium 50 and the porous material 19 is such that the porous material 19 is contained in a largest possible amount and in an amount that can maintain a bound state. For example, it is appropriate that the ratio by volume of the dispersion medium 50 to the overall outer layer 12 range from 5% to 30%. The ratio smaller than 5% might cause insufficient binding of the porous material 19 to the dispersion medium 50. The ratio larger than 30% allows the influence of the refractive index of the dispersion medium 50 to be exhibited strongly, so that the effect is lowered. With this configuration, although the emitted light is scattered by the outer layer 12, the light emission efficiency improves because a large amount of the porous material 19 with a low refractive index is present.

Examples of the dispersion medium 50 include a thermoplastic resin, a thermosetting resin such as a silicone resin, a radiation curable resin, an inorganic material such as a low melting glass and a sol-gel glass. In particular, by using the same material with the binder 17 or a material having an equivalent refractive index to the binder 17 as the dispersion medium 50, the light scattering at the interface with the phosphor layer 11 is reduced, resulting in an improved light emission efficiency. Further, when the dispersion medium 50 is made of the same material as the binder 17, the adhesiveness to the phosphor layer 11 improves. The semiconductor light-emitting device 7 may be formed by making the outer layer 12 that has been produced in advance adhere to the phosphor layer 11 or by printing a paste formed of the material of the outer layer 12 on the phosphor layer 11 and then drying or curing the above-noted paste.

Although Embodiments 1 to 7 of the present invention have been described above, the present invention is not limited to these embodiments. For example, a space may be provided partially between the individual layers. Also, an optical member such as a lens or a protective layer may be provided outside the outer layer. Further, an intermediate layer may be provided between the phosphor layer and the outer layer. In this case, it is preferable that the refractive index of the above-noted intermediate layer is lower than that of the binder in the phosphor layer and higher than that of the outer layer. This is because the light extraction efficiency can be improved further.

INDUSTRIAL APPLICABILITY

The present invention is applicable to, for example, an illuminating apparatus or the like as a semiconductor light-emitting device having a high light extraction efficiency.

The invention claimed is:

1. A semiconductor light-emitting device, comprising:
   a semiconductor light-emitting element;
   a phosphor layer that is formed so as to cover at least a part of the semiconductor light-emitting element; and
   an outer layer that is formed so as to cover at least a part of the phosphor layer;
   wherein the phosphor layer comprises a binder and a phosphor that is dispersed in the binder,
   the outer layer comprises a porous material,
   the binder comprises a binder material and an inorganic particle,
   the inorganic particle has an effective particle diameter equal to or smaller than a quarter of a wavelength of light emitted from the semiconductor light-emitting element, and
   the inorganic particle has a higher refractive index than the binder material.

2. The semiconductor light-emitting device according to claim 1, wherein light emitted from the semiconductor light-emitting element has a maximum peak wavelength of equal to or shorter than 490 nm.

3. The semiconductor light-emitting device according to claim 1, wherein the refractive index of the binder is lower than that of a material forming a principal surface on a light extraction side in the semiconductor light-emitting element and higher than that of the outer layer.

4. The semiconductor light-emitting device according to claim 1, wherein the porous material is formed of an inorganic material.

5. The semiconductor light-emitting device according to claim 4, wherein the porous material is an aggregated porous body of particles formed of the inorganic material.

6. The semiconductor light-emitting device according to claim 1, wherein the porous material is an aggregated porous body of particles formed of an inorganic material, the particles have a mean particle diameter equal to or smaller than a quarter of a wavelength of light passing through the outer layer, and the aggregated porous body has a mean pore diameter of equal to or smaller than the quarter of the wavelength of the light passing through the outer layer.

7. The semiconductor light-emitting device according to claim 1, further comprising a light-transmitting layer that is interposed between the semiconductor light-emitting element and the phosphor layer.

8. The semiconductor light-emitting device according to claim 7, wherein the refractive index of the light-transmitting layer is lower than that of a material forming a principal surface on a light extraction side in the semiconductor light-emitting element and higher than that of the binder in the phosphor layer.

9. The semiconductor light-emitting device according to claim 7, wherein the light-transmitting layer comprises a base material and an inorganic particle that is dispersed in the base material, and the inorganic particle has an effective particle diameter equal to or smaller than a quarter of a wavelength of light passing through the base material and a higher reflective index than the base material.

10. The semiconductor light-emitting device according to claim 1, wherein the outer layer and the phosphor layer are made to adhere to each other by the binder.

11. The semiconductor light-emitting device according to claim 1, wherein the outer layer further comprises a dispersion medium, and the porous material is dispersed in the dispersion medium.

12. The semiconductor light-emitting device according to claim 1, further comprising a case having a recessed portion in which the phosphor layer is filled, wherein the outer layer is disposed so as to cover an opening of the recessed portion.

13. The semiconductor light-emitting device according to claim 12, wherein the outer layer has a plate shape.

* * * * *